United States Patent
Toba et al.

(10) Patent No.: US 11,245,869 B2
(45) Date of Patent: Feb. 8, 2022

(54) TRANSMISSION APPARATUS, TRANSMISSION METHOD, RECEPTION APPARATUS, RECEPTION METHOD, AND TRANSMISSION/RECEPTION SYSTEM

(71) Applicant: SONY CORPORATION, Tokyo (JP)

(72) Inventors: Kazuaki Toba, Kanagawa (JP); Toshihisa Hyakudai, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/067,747

(22) PCT Filed: Mar. 16, 2017

(86) PCT No.: PCT/JP2017/010808
§ 371 (c)(1),
(2) Date: Jul. 2, 2018

(87) PCT Pub. No.: WO2017/169867
PCT Pub. Date: Oct. 5, 2017

(65) Prior Publication Data
US 2019/0014285 A1    Jan. 10, 2019

(30) Foreign Application Priority Data

Mar. 29, 2016  (JP) .............................. JP2016-066923

(51) Int. Cl.
*G06F 17/00* (2019.01)
*H04N 7/035* (2006.01)
(Continued)

(52) U.S. Cl.
CPC ........... *H04N 7/0352* (2013.01); *G06F 3/165* (2013.01); *G09G 5/006* (2013.01); *G09G 5/008* (2013.01);
(Continued)

(58) Field of Classification Search
CPC ........ H04N 7/0352; H04N 7/22; H04N 19/88; G06F 3/165; G09G 5/006; G09G 5/008;
(Continued)

(56) References Cited

U.S. PATENT DOCUMENTS 6,381,236 B1 *  4/2002  Miyashita ............... H04L 5/023
                                                    348/14.01
6,642,966 B1 * 11/2003  Limaye ............ H04N 21/23892
                                                     348/460
(Continued)

FOREIGN PATENT DOCUMENTS

EP              2739041 A1      6/2014

*Primary Examiner* — Paul C McCord
(74) *Attorney, Agent, or Firm* — Paratus Law Group, PLLC

(57) ABSTRACT

This technology is to enable high quality audio reproduction on the reception side without supplying a transmission clock using a clock signal line from the reception side to the transmission side. The transmission apparatus receives encoded data capable of clock recovery from a reception apparatus (external device), generates an audio clock on the basis of a carrier clock recovered from the encoded data, and transmits audio data to the reception apparatus in synchronization with the audio clock. The reception apparatus transmits the encoded data capable of clock recovery to the external device in synchronization with the carrier clock generated on the basis of an self-generating audio clock, receives the audio data from the transmission apparatus (external device), and processes the audio data on the basis of the self-generating audio clock.

13 Claims, 11 Drawing Sheets

(51) Int. Cl.
  *H03L 7/18*     (2006.01)
  *G09G 5/00*     (2006.01)
  *H04N 21/233*   (2011.01)
  *H04N 21/436*   (2011.01)
  *H04N 21/439*   (2011.01)
  *H04N 21/242*   (2011.01)
  *H04N 21/435*   (2011.01)
  *H04N 21/43*    (2011.01)
  *G06F 3/16*     (2006.01)
  *H04N 7/22*     (2006.01)
  *H04N 19/88*    (2014.01)

(52) U.S. Cl.
  CPC .............. *H03L 7/18* (2013.01); *H04N 7/22* (2013.01); *H04N 21/233* (2013.01); *H04N 21/242* (2013.01); *H04N 21/435* (2013.01); *H04N 21/436* (2013.01); *H04N 21/4307* (2013.01); *H04N 21/439* (2013.01); *G09G 2370/18* (2013.01); *H04N 19/88* (2014.11)

(58) Field of Classification Search
  CPC ...... H03L 7/18; H94N 21/233; H94N 21/242; H94N 21/4307; H94N 21/435; H94N 21/436; H94N 21/439; G06G 2370/18
  USPC .......................................................... 700/94
  See application file for complete search history.

(56) References Cited

U.S. PATENT DOCUMENTS 9,154,726 B2 * 10/2015  Maeda ............... H04N 21/4325
2004/0179510 A1 *  9/2004  Kuffner ................ G06K 7/0008
                                                    370/350
2005/0078683 A1 *  4/2005  Page .................... G10H 1/0058
                                                    370/395.5
2008/0298532 A1 * 12/2008  Wang ................. H04N 21/4305
                                                    375/376
2009/0109840 A1 *  4/2009  Hallse .................... H04L 49/10
                                                    370/218
2009/0161017 A1 *  6/2009  Glen ....................... H04N 5/775
                                                    348/624
2009/0220229 A1 *  9/2009  Markus ................. H04J 3/1652
                                                    398/50
2009/0257453 A1 * 10/2009  Yanagisawa ........... H04N 7/083
                                                    370/480
2010/0189104 A1 *  7/2010  Ichimura ................ G09G 5/008
                                                    370/389
2011/0075782 A1 *  3/2011  Zhang .................... H03L 7/193
                                                    375/376
2012/0056649 A1 *  3/2012  Lin ........................ H04L 7/005
                                                    327/113
2012/0147266 A1 *  6/2012  Sridharan .......... H04N 21/8547
                                                    348/515
2013/0322462 A1 * 12/2013  Poulsen .................... H04J 3/06
                                                    370/458
2014/0294200 A1 * 10/2014  Baumgarte ............. H03G 3/20
                                                    381/107
2015/0015311 A1 *  1/2015  Kouyama .............. H03K 21/10
                                                    327/115
2015/0382050 A1 * 12/2015  Le Nerriec ............ H04L 45/16
                                                    725/80
2016/0357504 A1 * 12/2016  Khazin ..................... G06F 1/08

* cited by examiner

TRANSMISSION APPARATUS, TRANSMISSION METHOD, RECEPTION APPARATUS, RECEPTION METHOD, AND TRANSMISSION/RECEPTION SYSTEM

CROSS REFERENCE TO PRIOR APPLICATION

This application is a National Stage Patent Application of PCT International Patent Application No. PCT/JP2017/010808 (filed on Mar. 16, 2017) under 35 U.S.C. § 371, which claims priority to Japanese Patent Application No. 2016-066923 (filed on Mar. 29, 2016), which are all hereby incorporated by reference in their entirety.

TECHNICAL FIELD

The present technology relates to a transmission apparatus, a transmission method, a reception apparatus, a reception method, and a transmission/reception system, and more particularly relates to a transmission apparatus or the like that enables high quality audio reproduction on the reception side.

BACKGROUND ART

For example, Patent Document 1 proposes a technique in which a transmission clock is supplied from a reception side to a transmission side using a clock signal line, and then audio data is transmitted from the transmission side to the reception side in synchronization with an audio clock obtained by dividing the transmission clock so as to enable high quality audio reproduction on the reception side.

CITATION LIST

Patent Document

Patent Document 1: Japanese Patent Application Laid-Open No. 2013-074547

SUMMARY OF THE INVENTION

Problems to be Solved by the Invention

The present technology aims to enable high quality audio reproduction on the reception side without supplying the transmission clock using the clock signal line from the reception side to the transmission side.

Solutions to Problems

A concept of the present technology is a transmission apparatus is a transmission apparatus including:
an encoded data reception unit that receives encoded data capable of clock recovery from an external device;
an audio clock generator that generates an audio clock on the basis of a carrier clock recovered from the received encoded data; and
an audio data transmission unit that transmits the audio data to the external device in synchronization with the generated audio clock.

In the present technology, encoded data is received from an external device by the encoded data reception unit. This encoded data is capable of clock recovery. For example, encoded data capable of clock recovery may be encoded data of 8B10B coding.

An audio clock is generated by the audio clock generator on the basis of a carrier clock (transmission clock) recovered from the received encoded data. For example, the audio clock generator may generate the audio clock by dividing the carrier clock on the basis of dividing ratio information obtained from the received encoded data. In this case, the division is performed on the basis of the dividing ratio information transmitted from, the external device, making it possible to easily and properly generate the audio clock.

Audio data is transmitted to the external device by the audio data transmission unit in synchronization with the generated audio clock. For example, the audio data transmission unit may transmit the audio data to the external device through a first physical channel, and the encoded data reception unit may receive the encoded data from the external device through a second physical channel. In this case, for example, each of the first physical channel and the second physical channel may be a physical channel using an optical cable.

In this manner, according to the present technology, audio data is transmitted to an external device in synchronization with the audio clock generated on the basis of the carrier clock recovered from the received encoded data. Therefore, it is possible to perform high quality audio reproduction in an external device without supplying a transmission clock using a clock signal line from the external device.

Note that in the present technology when a request for using the audio cloak generated from the recovered carrier clock can be obtained for example, the audio clock generator may generate an audio clock on the basis of the carrier clock recovered from the encoded data, and the audio data transmission unit may transmit the audio data to the external device in synchronization with the generated audio clock. With execution of the transmission processing of the audio data based on the audio clock generated from the recovered carrier clock in response to the request from the external device in this manner, the transmission processing can be effectively performed.

Furthermore, another concept of the present technology is a reception apparatus including:
an audio clock generator that generates an audio clock;
an encoded data transmission unit that transmits encoded data capable of clock recovery in synchronization with a carrier clock generated on the basis of the generated audio clock to an external device;
an audio data reception unit that receives audio data from the external device; and
an audio data processing unit that processes the received audio data on the basis of the generated audio clock.

In the present technology, an audio clock is generated by the audio clock generator. Encoded data capable of clock recovery in synchronization with the carrier clock generated on the basis of the generated clock is transmitted to the external device by the encoded data transmission unit.

Audio data is received from the external device by the audio data reception unit. The audio data processing unit processes the received audio data on the basis of the audio clock generated by the audio clock generator. For example, the audio data reception unit may receive the audio data from the external device through a first physical channel, and the encoded data transmission unit may transmit the encoded data to the external device through a second physical channel. In this case, for example, each of the first physical channel and the second physical channel may be a physical channel using an optical cable.

In this manner, according to the present technology, encoded data capable of clock recovery is transmitted to an external device in synchronization with a carrier clock generated on the basis of the generated audio clock, and audio data received from the external device is processed on the basis of the audio cock. Therefore, it is possible to perform high quality audio reproduction without supplying a transmission clock using a clock signal line to an external device.

Note that it is also allowable in the present technology to configure such that the encoded data includes encoded data of dividing ratio information for obtaining the audio clock from the carrier clock, for example. With this encoded data included, the external device can obtain the audio clock by performing division on the carrier clock recovered from the encoded data on the basis of the dividing ratio information, making it possible to generate the audio clock easily and appropriately.

Furthermore, it is allowable in the present technology to configure such that the encoded data includes encoded data of a request for using an audio clock generated on the basis of the carrier clock, for example. With this encoded data included, the external device can effectively perform the transmission processing of the audio data based on the audio clock generated by division of the recovered carrier clock.

Effects of the Invention

According to the present technology, it is possible to achieve high quality audio reproduction on the reception side without supplying the transmission clock using the clock signal line from the reception side to the transmission side Effects described here in the present specification are provided for purposes of exemplary illustration and are not intended to be limiting. Still other additional effects may also be contemplated.

MODE FOR CARRYING OUT THE INVENTION

Hereinafter, embodiments of the present invention (hereinafter, embodiment(s)) will be described. Note that the description will be given in the following order.
1. Embodiments
2. Modifications 1. Embodiments

Figure 1:
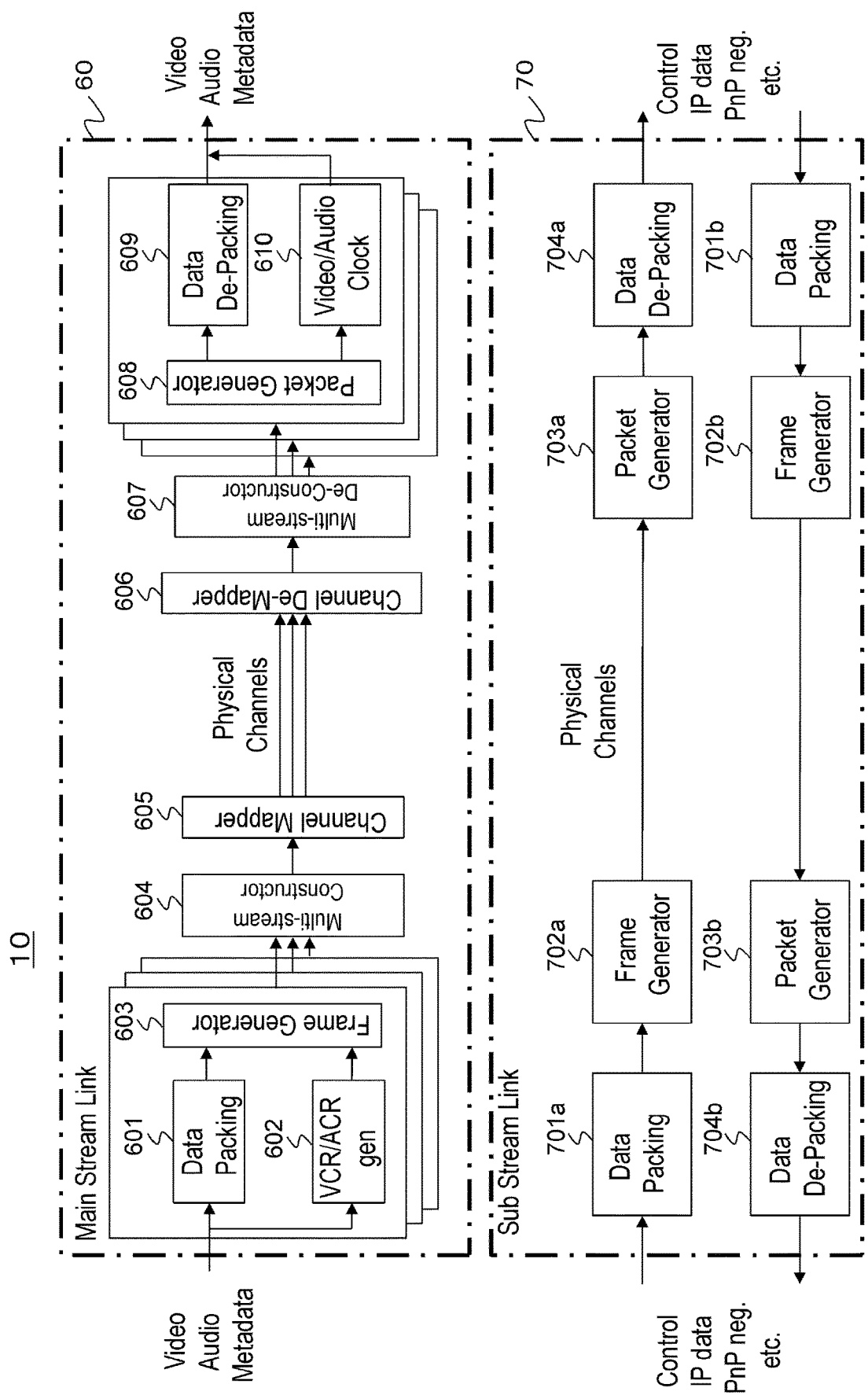
FIG. 1 is a block diagram illustrating an outline of an AV transmission system as an embodiment.

[Configuration of AV Transmission System]
FIG. 1 illustrates an outline of an audio and visual (AV) transmission system 10 as an embodiment. The AV transmission system 10 includes a main stream link 60 and a sub stream link 70.

In the main stream link 60, mainly audio/video signals are transmitted. A plurality streams of transmitted video and audio, accompanying metadata or the like, are packed for individual streams by a data packing unit (Data Packing) 601. Furthermore, the dividing ratios for the recovery of the video and audio clocks from the carrier clock are respectively generated as video clock recovery information (VCR) and audio clock recovery information (ACR) by a VCR/ACR generator (VCR/ACR gen) 602.

A lane frame containing packed transmission data and generated recovery information is generated by a frame generator 603. The lane frames obtained by the frame generator 603 of a plurality of systems are grouped together by a multi-stream constructor 604, and further mapped to individual physical channels by a channel mapper 605 to be transmitted.

Lane frames transmitted on individual physical channels are de-mapped by a channel de-mapper 606, and further de-constructed into lane frames of a plurality of systems by a multi-stream de-constructor 607. Then, a packet including video, audio, accompanying metadata or the like is retrieved from the lane frame by a packet generator 608 in each of the systems.

A data de-packing unit (Data De-Packing) 609 extracts video, audio, accompanying metadata or the like from packets containing video, audio, accompanying metadata, or the like. Furthermore, in the video/audio clock unit (Video/Audio Clock) 610, recovery information (VCR and ACR) is extracted from the packet including the recovery information, and the recovery information is used to recover the video and audio clocks.

Meanwhile, in the sub stream link 70, control information or the like, that is, a control signal (Control) Ethernet data (IP data), plug and play data (PnP neg), or the like, are transmitted bidirectionally. Control information or the like is packed in data packing units (Data Packing) 701a and 701b. A lane frame containing packed control information is generated by frame generators 702a and 702b and transmitted via the physical channels.

Packet generators 703a and 703b retrieve packets containing a control signal (Control), Ethernet data (IP data), plug and play data (PnP neg) and the like from the lane frame transmitted via the physical channel. Then, data de-packing units (Data De-Packing) 704a and 704b extracts control signal (Control), Ethernet data (IP data), plug and play data (PnP neg) or the like from the packet that has been retrieved.

The transmission of audio data in the AV transmission system 10 is normally processed by operation in the normal mode as described below. That is, audio data is transmitted from the transmitter to the receiver by the main stream link in synchronization with the audio clock generated in the transmitter, and together with this, the dividing ration information (recovery information) for recovery of an audio clock from the carrier clock of the main stream link is transmitted by the main stream link. The receiver uses the dividing ratio indicated by the dividing ratio information to recover the audio clock from the carrier clock of the main stream link, and this audio clock is used to process the audio data.

In the present embodiment, in a case where there is a request from the receiver to the transmitter, option mode operation as below is performed in association with the transmission of audio data in the AV transmission system 10. That is, the transmitter divides the carrier clock of the sub stream link of the receiver to generate an audio clock, and audio data is transmitted by the main stream link in synchronization with this audio clock. The receiver processes the received audio data on the basis of the audio clock generated within the receiver. With this option mode operation, it is possible to reproduce high quality audio on the receiver.

Figure 2:
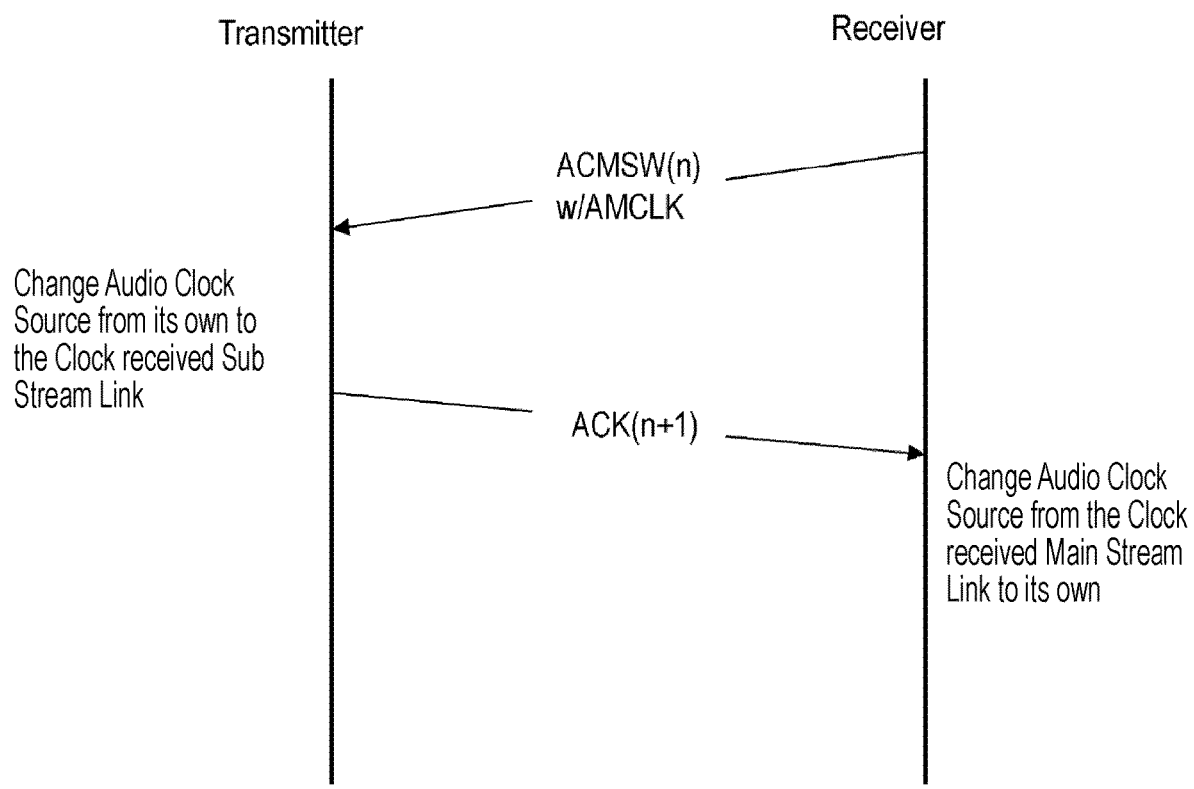
FIG. 2 is a diagram illustrating a sequence of transition from a normal mode to an option mode in audio data transmission.

FIG. 2 illustrates a sequence diagram at the time of transition from the normal mode to the option mode in association with transmission of audio data. The receiver use the sub stream link to transmit to the transmitter an audio clock master switch (ACMSW) packet unit on which an audio master clock (AMCLK) switch request representing a switch request to the option mode with the audio clock on the receiver side as a master.

In a case where the request can be handled, the transmitter that received the ACMSW packet unit generates an audio clock on the basis of the dividing ratio information (ACR information) stored in the ACMSW packet unit from the carrier clock of the sub stream link of the receiver as an audio clock, then, switches to an audio data transmission state in synchronization with this audio clock, and returns an ACK command to the receiver by a sub stream link. After reception of the ACK command, the receiver switches the audio clock to the audio clock generated in the receiver, and performs reproduction of the audio.

Figure 3:
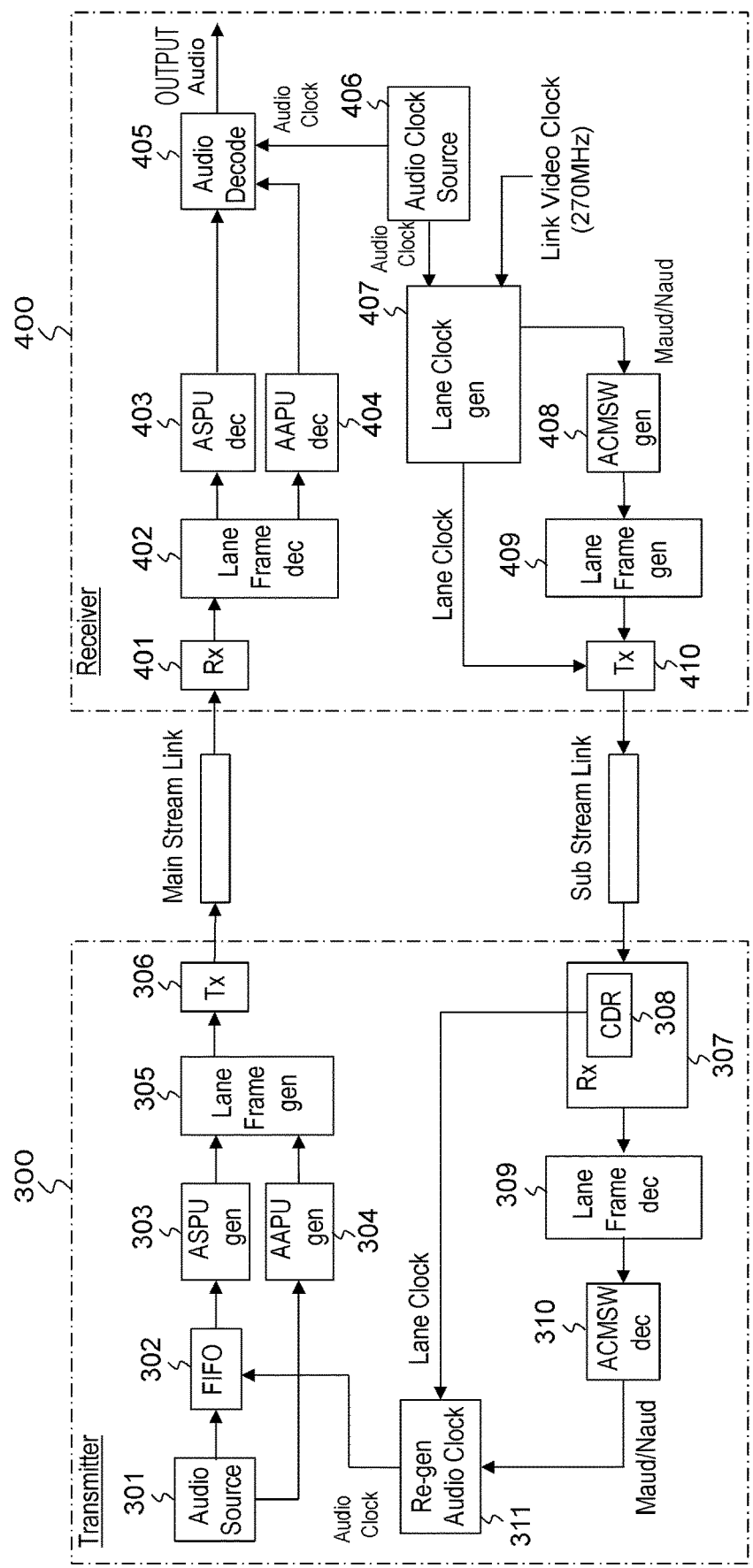
FIG. 3 is a block diagram illustrating a configuration example of a portion related to audio data transmission in a transmitter and a receiver in an option mode.

FIG. 3 illustrates a configuration example of a portion related to audio data transmission of a transmitter 300 and a receiver 400 in the above-described option mode. The transmitter 300 includes an audio source 301, a FIFO memory unit 302, an audio sample packet unit (ASPU) generator 303, an ancillary audio data packet unit (AAPU) generator 304, a lane frame generator 305, and a transmission unit 306 of the main stream link. Furthermore, the transmitter 300 further includes a reception unit 307 of the sub stream link, a lane frame decoding unit 309, an ACMSW decoding unit 310, and an audio clock recovery unit (Re-gen Audio Clock) 311.

The receiver 400 includes a reception unit 401 of the main stream link, a lane frame decoding unit 402, an ASPU decoding unit 403, an AAPU decoding unit 404, and an audio decoding unit 405. Furthermore, the receiver 400 includes an audio clock source 406, a lane clock generator 407, an ACMSW generator 408, a lane frame generator 409, a transmission unit 410 of the sub stream link.

The audio source 301 outputs uncompressed or compressed audio data (audio sample data) as audio data as transmission target, and outputs audio additional information at the same time. The audio additional information includes information such as sampling frequency, sample size, and an encoding method (uncompressed, compression method). The FIFO memory unit 302 inputs the audio data as transmission target output from the audio source 301, and outputs the audio data in synchronization with the audio clock recovered by the audio clock recovery unit 311.

The ASPU generator 303 packs audio data input in synchronization with the audio clock from the FIFO memory unit 302, and generates an AS packet unit (ASPU) having audio data inserted in a payload. The AAPU generator 304 packs audio additional information output from the audio source 301, and generates an AA packet unit (AAPU) having audio additional information inserted in a payload.

The lane frame generator 305 generates a lane frame containing an AS packet unit generated by the ASPU generator 303, an AA packet unit generated by the AAPU generator 304, or the like, as a payload unit.

Figure 4:
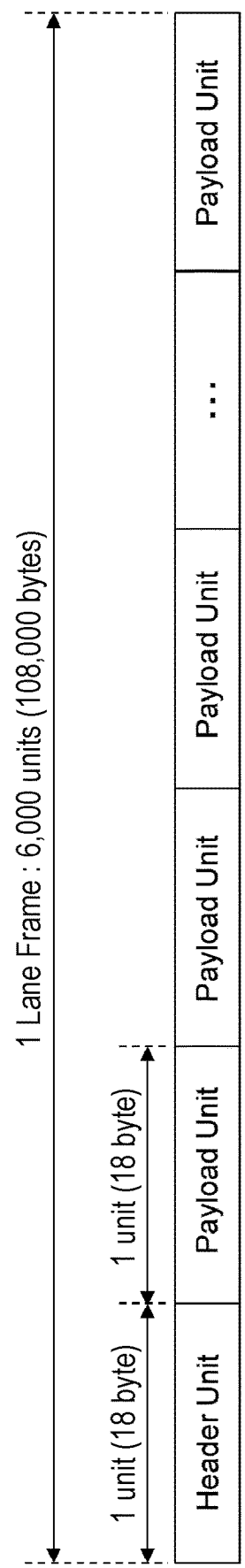
FIG. 4 is a diagram illustrating a structural example of a lane frame.

FIG. 4 illustrates a structural example of a lane frame. The structure of the lane frame is a collection of structures referred to as units. The lane frame includes 6000 units, for example, including: a header unit containing attributes and synchronization information of the lane frame; and a payload unit storing individual data. Each of the units has a fixed length and has a special code referred to as a delimiter in the first two bytes and the last byte. A reception side lane frame decoder (Lane Frame dec) can determine the content of each of the payload units by the content of the delimiter.

Examples of the payload unit include the AS packet unit (ASPU) and the AA packet unit (AAPU) transmitted on the main stream link, and in addition to this, a sub stream packet unit (SSPU) for bidirectionally transmitting a control signal on the sub stream link, and the like.

Returning to FIG. 3, the transmission unit 306 transmits the lane frame of the main stream link generated by the lane frame generator 305 electrically or optically—optically using an optical cable in the present embodiment—to the receiver 400 by the main stream link.

Figure 5:
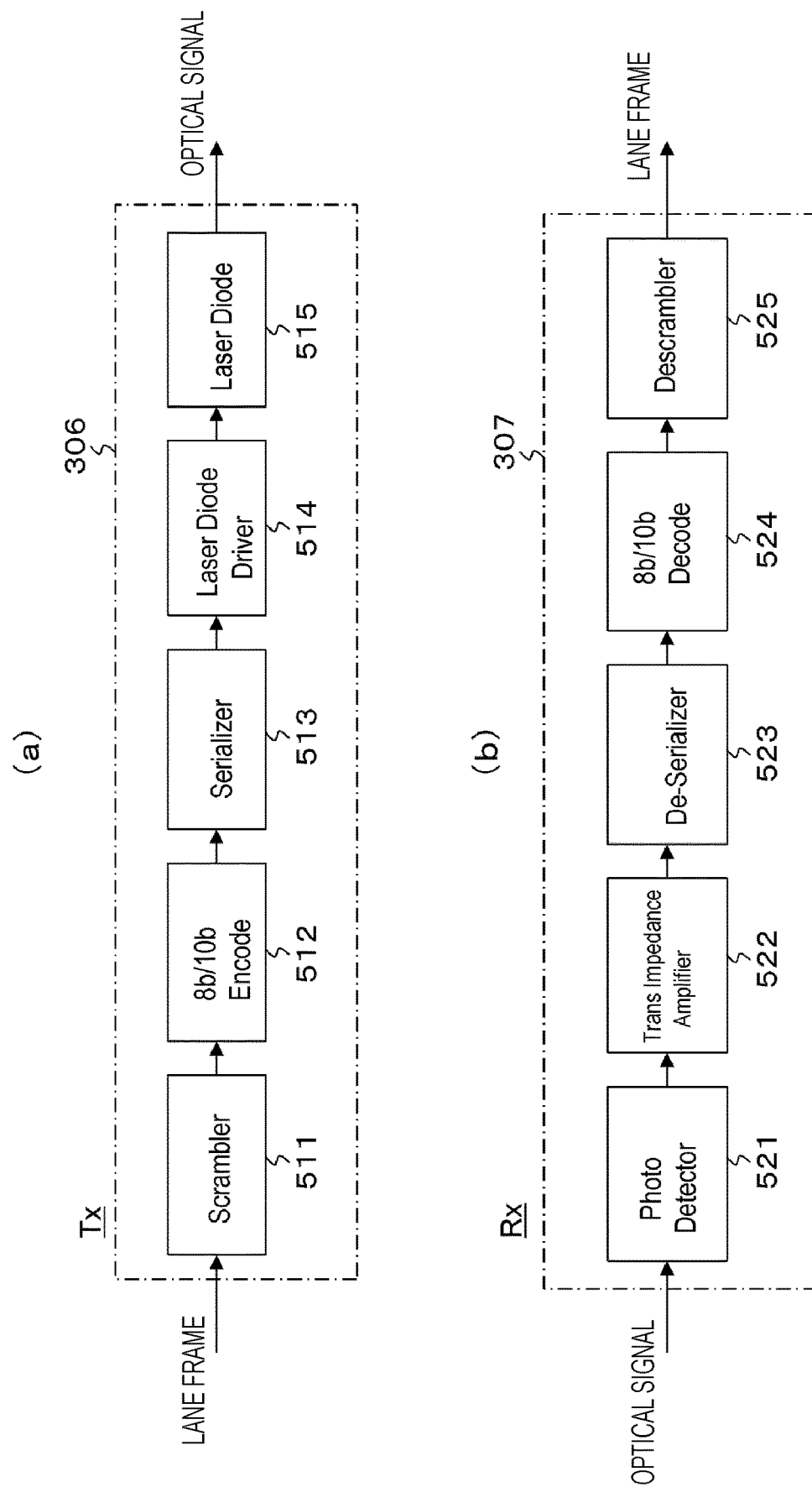
FIG. 5 is a block diagram illustrating a configuration example of a transmission unit and a reception unit.

FIG. 5(*a*) illustrates a configuration example of the transmission unit 306. The transmission unit 306 includes a scrambler 511, an 8B/10B encoder (8b/10b Encode) 512, a serializer 513, a laser diode driver 514, and a laser diode 515.

The data of the lane frame output from the lane frame generator 305 is input to the scrambler 511. The scrambler 511 scrambles data of the lane frame. In this case, the data of the lane frame is rearranged randomly, and the continuity of the data is removed. This scrambling achieves data retention in an AC coupling transmission line and also suppresses unnecessary radiation in the physical channel.

Figure 6:
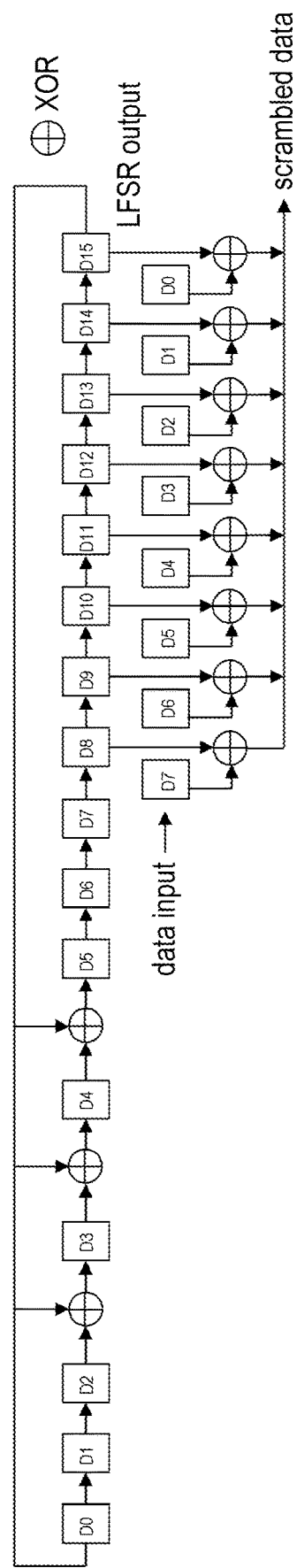
FIG. 6 is a block diagram illustrating a configuration example of a scrambler.

The scrambler 511 is formed with linear feedback shift register having a feedback path based on a certain generator polynomial, and takes an exclusive OR (XOR) with input data (data input) so as to output converted scrambled data. FIG. 6 illustrates a configuration example of the scrambler 511. In the illustrated example, the generation other row formula is "$G(x)=x^{16}+x^5+x^4+x^3+1$" with linear feedback shift register of 16 bits.

Returning to FIG. 5(*a*), data output from the scrambler 511 is input to the 8B/10B encoder 512. The 8B/10B encoder 512 performs encode processing of 8B10B coding on input data. In this case, the 8-bit data is converted into 10-bit data to ensure the frequency of change of the data so as to enable elimination of the DC component of the data to be transmitted and extraction of reception clock from reception data at the reception circuit.

Figure 7:
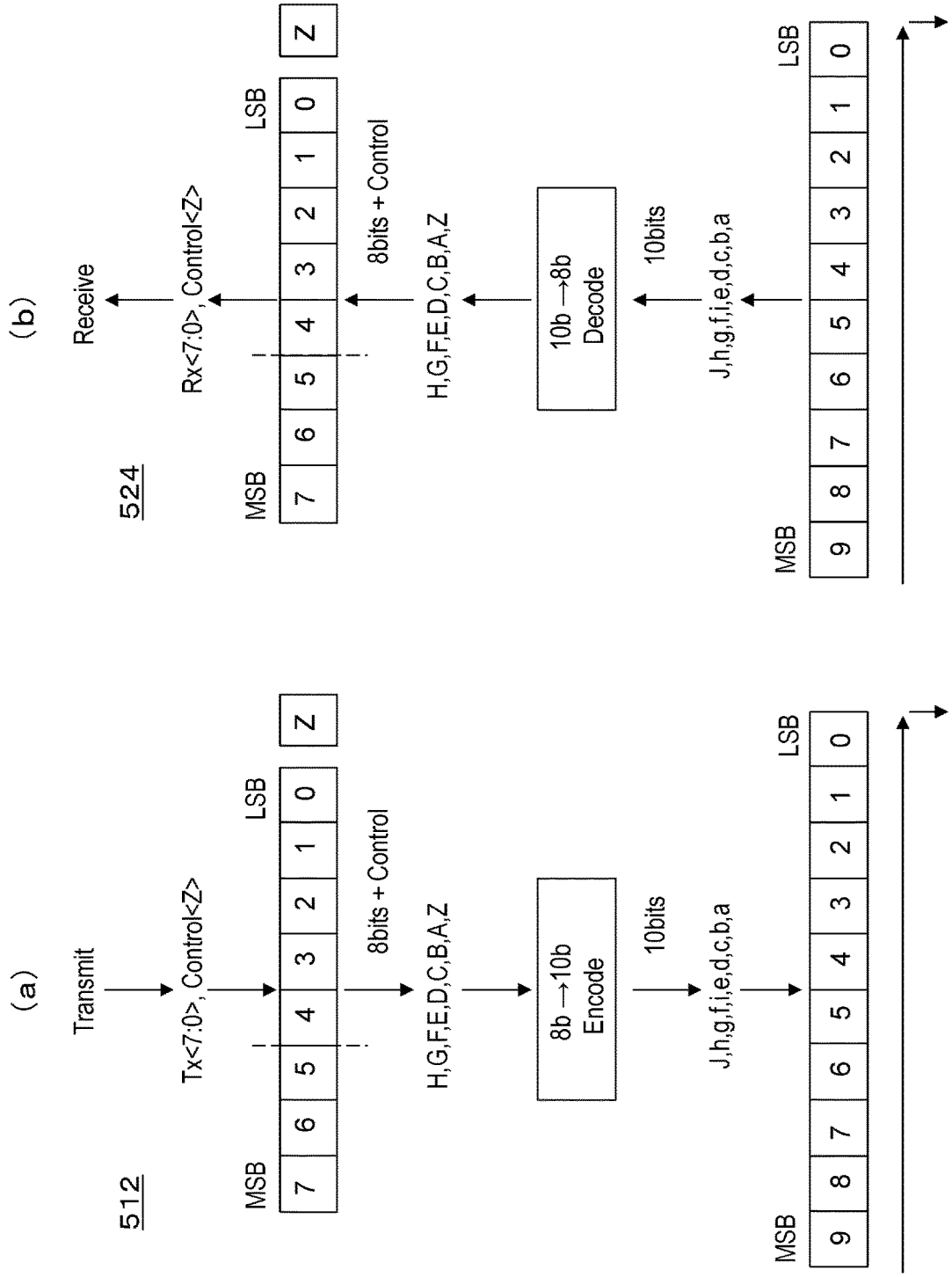
FIG. 7 is a block diagram illustrating a circuit configuration example of an 8B/10B encoder and 8B/10B decoder.

FIG. 7(*a*) illustrates a circuit configuration example of the 8B/10B encoder 512. In this case, the input data (Transmit) from the scrambler 511 is input to an encoder (8b→10b Encode) as 9-bit data including a control bit (Z), and then, output as 10-bit data. Here, fixed data for synchronization referred to as a control symbol may be inserted as appropriate.

Returning to FIG. 5(a), the data output from the 8B/10B encoder 512 is input to the serializer 513. The serializer 513 converts input data from parallel data to serial data. Note that the 8B/10B encoder 512 described above performs encode processing of 8B10B coding on data to enable the byte delimiter of each of data to be easily recognized by the reception circuit.

Data output from the serializer 513 is input to the laser diode driver 514. The laser diode driver 514 drives the laser diode 515 on the basis of the input data and causes the laser diode 515 to output an optical signal to be transmitted on the main stream link.

The reception unit 307 receives the lane frame of the sub stream Link transmitted electrically or optically—optically using an optical cable in the present embodiment—from the receiver 400 by the sub stream link.

FIG. 5(b) illustrates a configuration example of the reception unit 307. The reception unit 307 includes a photodetector (Photo Detector) 521, an amplifier (Trans impedance Amplifier) 522, a de-serializer (De-Serializer) 523, an 8B/10B decoder (8b/10b Decode) 524, and a descrambler 525.

The optical signal transmitted on the sub stream link is input to the photodetector 521 and converted into an electric signal. This electric signal is amplified by the amplifier 522. Data (electric signal) output from the amplifier 522 is input to the de-serializer 523. The de-serializer 523 converts the input data from serial data to parallel data.

Note that this de-serializer 523 includes a clock and data recovery circuit (CDR) 308 in a preceding stage, recovers the carrier clock (lane clock) from the input data from the amplifier 522, and receives data reliably on the basis of the carrier clock.

Figure 8:
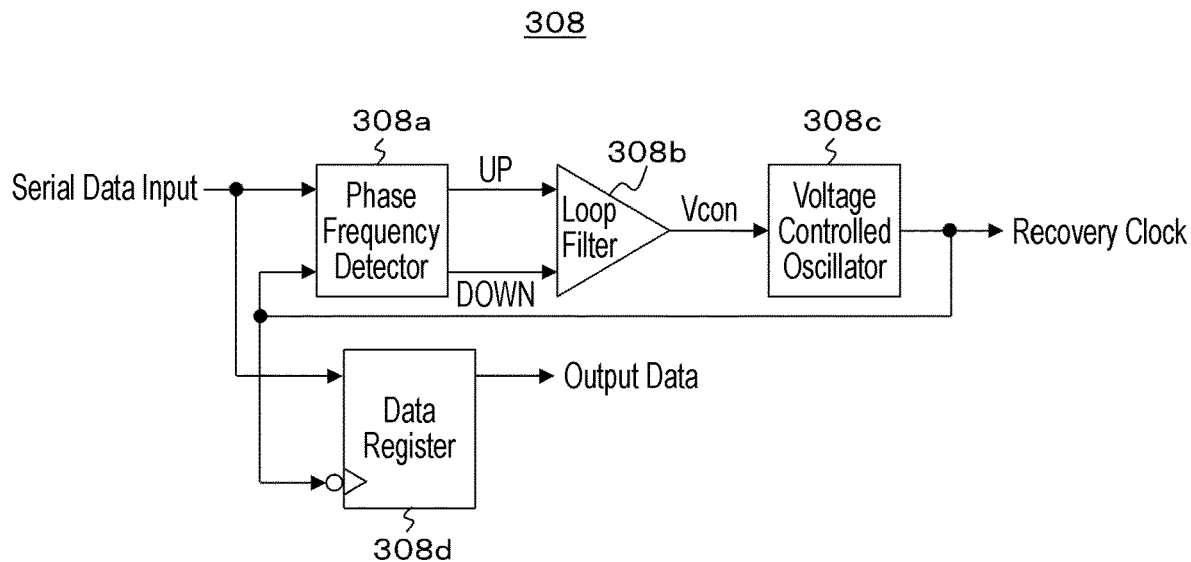
FIG. 8 is a block diagram illustrating a configuration example of a clock and data recovery circuit.

FIG. 8 illustrates a configuration example of the clock and data recovery circuit 308. Serial data (Serial Data Input) as input data from the amplifier 522 is supplied to a phase frequency detector 308a. A phase locked loop (PLL) circuit is formed with a phase frequency detector 308a, a loop filter 308b, and a voltage controlled oscillator (VCO) 308c.

The clock (Recovery Clock) obtained by the voltage controlled oscillator 308c is phase-compared with serial data (Serial Data Input), that is, input data from the amplifier 522 by the phase frequency detector 308a. An obtained comparison error signal is supplied from the loop filter 308b as a voltage control signal Vcon to the voltage controlled oscillator 308c. As a result, the clock (Recovery Clock) obtained by the voltage controlled oscillator 308c synchronized with input data from the amplifier 522.

Furthermore, serial data (Serial Data Input) as input data from the amplifier 522 is input to the data register 308d and latched by the clock (Recovery clock) obtained by the voltage controlled oscillator 308c. With this operation, data synchronized with the clock (Recovery clock) obtained by the voltage controlled oscillator 308c is obtained as the output data of the data register 308d.

Returning to FIG. 5(b), the data output from the de-serializer 523 is input to the 8B/10B decoder 524. The 8B/10B decoder 524 applies decode processing of 8B10B coding on the input data to obtain 8-bit data.

FIG. 7(b) illustrates an example of a circuit configuration of the 8B/10B decoder 524. In this case, the configuration is reverse arrangement of the 8B/10B encoder 512 in FIG. 7(a), in which the 10-bit data from the de-serializer 523 is input to the decoder (10b→8b Decode) and output as 9-bit data containing a control bit (Z).

Returning to FIG. 5(b), the data output from the 8B/10B decoder 524 is input to the descrambler 525. The descrambler 525 performs descrambling that is reverse of that performed in the scrambler 511 of the transmission unit 306, and outputs lane frame data.

Returning to FIG. 3, the lane frame decoding unit 309 retrieves a payload unit contained in the lane frame received by the reception unit 307, here, an ACMSW packet unit. The ACMSW decoding unit 310 obtains dividing ratio information (ACR information) stored in the ACMSW packet unit retrieved by the lane frame decoding unit 309. This dividing ratio information includes two values, Maud and Naud.

The audio clock recovery unit 311 recovers an audio clock from the carrier clock (Lane Clock) recovered by the CDR 308 of the reception unit 307 and from Maud and Naud. In this case, a 1.215 GHz carrier clock (Lane Clock) is divided to generate a 270 MHz video clock (Link Video Clock), for example, and then, the audio clock (Audio Clock) is recovered from this video clock (Link Video Clock) and Maud and Naud. As will be described below in detail, Naud is defined as a count interval of an audio clock, while Maud is defined as a count value of a video clock (Link Video Clock) at that interval.

Here, there is a relationship of the following formula (1) between the carrier clock (Lane Clock) and the video clock (Link Video Clock). Furthermore, there is a relationship of the following formula (2) between the audio clock, the video clock (Link Video Clock), and Maud and Naud.

$$\text{Link Video Clock} \times \tfrac{9}{2} \times 10 = \text{Lane Clock} \quad (1)$$

$$\text{Audio Clock} \times \text{Maud} = \text{Link Video Clock} \times \text{Naud} \quad (2)$$

An example of the combination of Maud and Naud is as follows. That is, Maud=61875, Naud=5632 in a case where Audio Clock=24.5760 MHz (sampling frequency=192 kHz).

Figure 9:
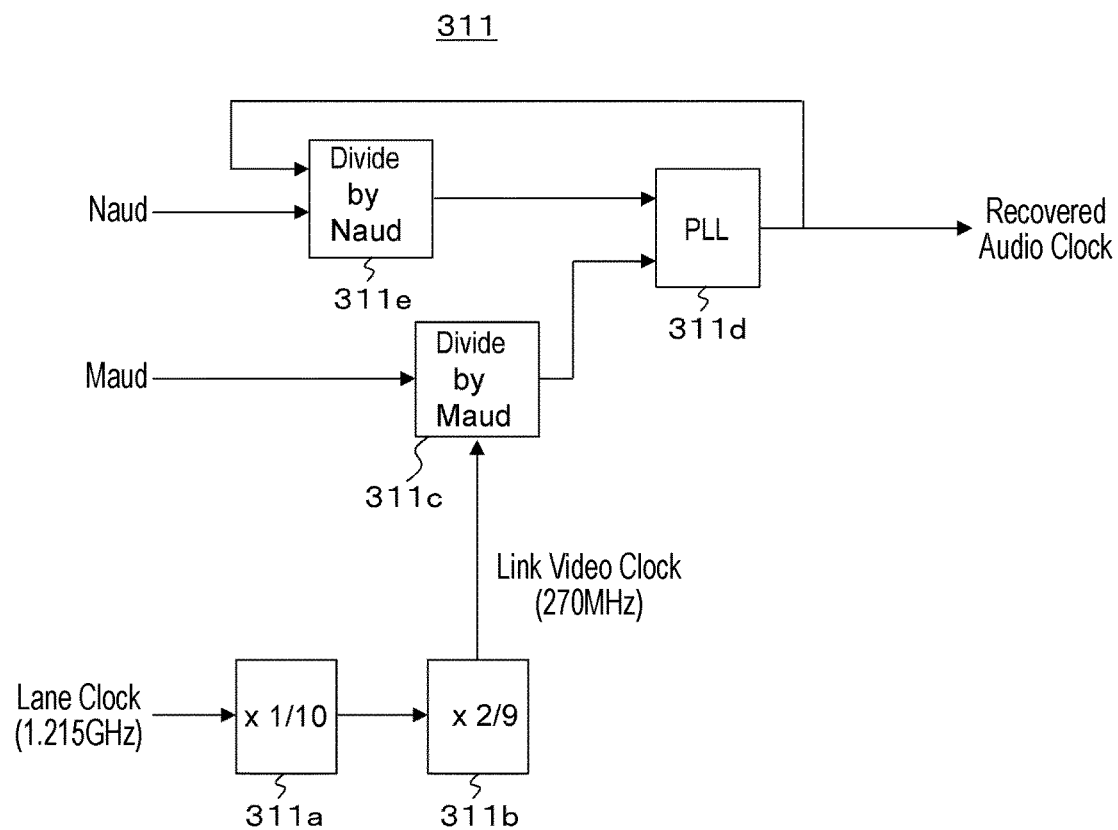
FIG. 9 is a block diagram illustrating a configuration example of an audio clock recovery unit.

FIG. 9 illustrates a configuration example of the audio clock recovery unit 311. The carrier clock (Lane Clock) is divided by 1/10 by the divider 311a, and its output clock is further divided by 2/9 by the divider 311b, leading to acquisition of a video clock (Link Video Clock). Then, the clock obtained by 1/Maud division of the video clock (Link Video Clock) by the divider (Divide by Maud) 311c and the clock obtained by 1/Naud division of the output clock from the PLL circuit 311d by the divider (Divide by Naud) 311e are input to the PLL circuit 311d to undergo phase comparison, leading to acquisition of an audio clock as an output clock from the PLL circuit 311d.

Returning to FIG. 3, the reception unit 401 receives the lane frame transmitted electrically or optically—optically using an optical cable in the present embodiment—from the transmitter 300 by the main frame link. Although detailed description is omitted, the reception unit 401 is configured similarly to the reception unit 307 in the transmitter 300 (refer to FIG. 5(b)).

The lane frame decoding unit 402 applies decode processing on the lane frame received by the reception unit 401 and extracts an AS packet unit (ASPU) and an AA packet unit (AAPU). As described above, the AS packet unit is a unit packet having audio data inserted in a payload, and the AA packet unit is a packet unit having audio additional information inserted in a payload.

The ASPU decoding unit 403 applies decode processing on the AS packet unit extracted by the lane frame decoder 402 and extracts audio data. The AAPU decoding unit 404 applies decode processing on the AA packet unit extracted by the lane frame decoder 402 and extracts audio additional information.

The audio clock source 406 generates an audio clock. The audio decoding unit 405 processes audio data retrieved by the ASPU decoding unit 403 in synchronization with the audio clock generated by the audio clock source 406 on the basis of the audio additional information retrieved by the AAPU decoding unit 404 so as to obtain output audio data for sound output. Then, the audio decoding unit 405 outputs the output audio data in synchronization with the audio clock generated by the audio clock source 406.

A carrier clock (Lane Clock) generator 407 generates a carrier clock (lane clock) of 1.215 GHz on the basis of an audio clock and a video clock (Link Video Clock) of 270 MHz, and also outputs the two values Maud and Naud as dividing ratio information. Here, Naud is defined as a count interval of an audio clock, while Maud is defined as a count value of a video clock (Link Video Clock) at that interval.

Figure 10:
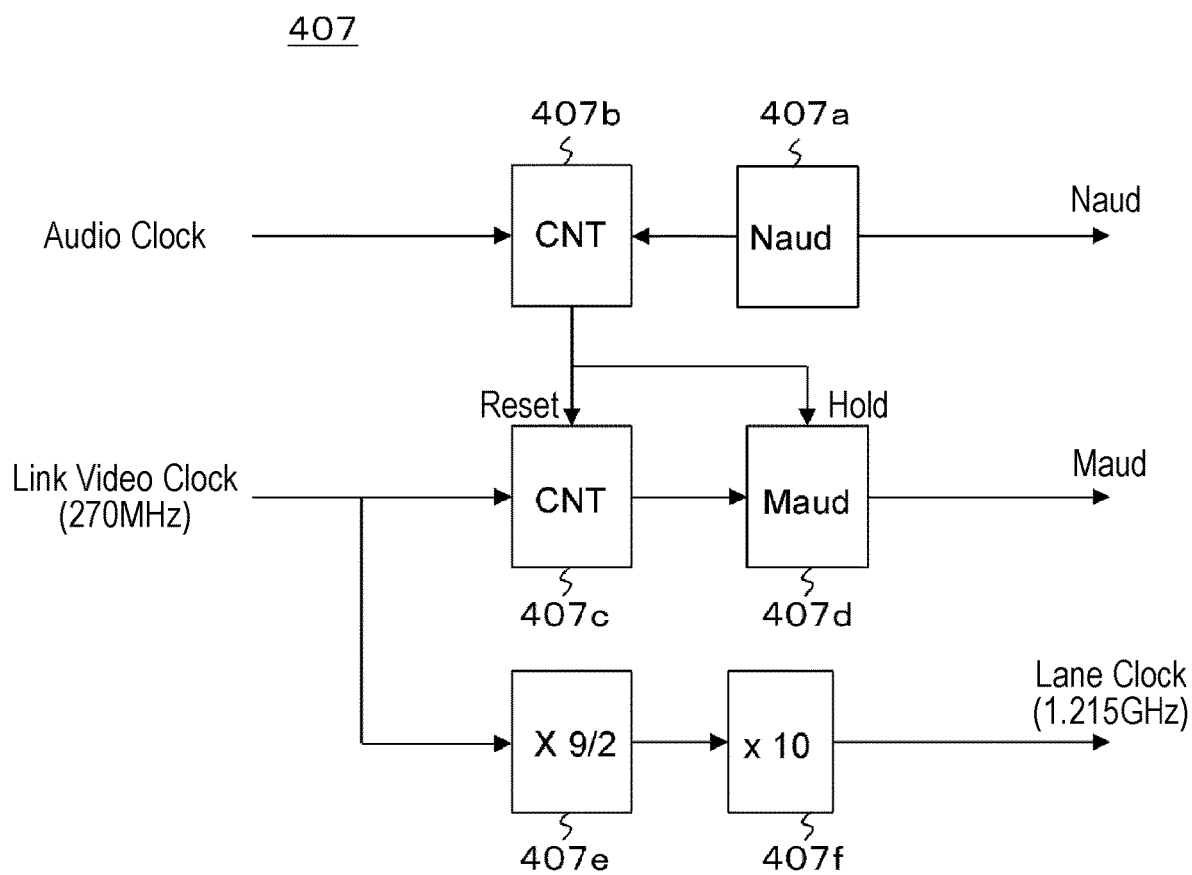
FIG. 10 is a block diagram illustrating a configuration example of a carrier clock generator.

FIG. 10 illustrates a configuration example of the carrier clock generator 407. The counting unit 407b functions as a Naud advancing counter based on the value of Naud generated by the Naud generator 407a, and performs counting operation using the audio clock as the count clock. The carry output of the counting unit 407b is supplied to the counting unit 407c as a reset signal, and is also supplied as a latch (hold) signal to the latch unit 407d.

The counting unit 407c is reset by the carry output of the counting unit 4071 and performs counting operation using the 270 MHz video clock (Link Video Clock) as the count clock. The count output of the counting unit 407c is input to the larch unit 407d. The latch unit 407d holds the count output of the counting unit 407c by the carry output of the counting unit 407b and obtains the value of Maud.

A multiplier 407e multiplies the 270 MHz video clock (Link Video Clock) by 9/2. Furthermore, the multiplier 407f multiplies the output clock of the multiplier 407e by ten to obtain a carrier clock (Lane Clock) of 1.215 GHz.

The carrier clock generator 407 outputs a 1.215 GHz carrier clock (Lane Clock) obtained by the multiplier 407f, and also outputs the value of Naud generated by the Naud generator 407a and the value of Maud held by the latch unit 407d. In this case, the carrier clock (Lane Clock) and the video clock (Link Video Clock) satisfy the relationship of the above formula (1). Furthermore, the audio clock (Audio Clock), the video clock (Link Video Clock), and Maud and Naud satisfy the relationship of the above formula (2).

Returning to FIG. 3, the ACMSW generator 408 generates an audio clock master switch (ACMSW) packet unit as an SS packet unit. The ACMSW packet unit includes an audio master clock switch request (AMCLK) indicating a switch request to an option mode with the audio clock on the side of the receiver 400 as a master, and also includes Maud and Naud as dividing ratio information output from the carrier clock generator 407.

The lane frame generator 409 generates a lane frame including the SS packet unit such as the ACMSW packet unit generated by the ACMSW generator 408 as a payload unit (refer to FIG. 4).

The transmission unit 410 transmits the lane frame of the sub stream link generated by the lane frame generator 409 electrically or optically—optically using an optical cable in the present embodiment—to the transmitter 300 by the sub stream link. The transmission unit 410 is configured similarly to the transmission unit 306 in the transmitter 300 (refer to FIG. 5(a)). In this case, output data from the 8B/10B encoder 512 is converted from parallel data to serial data by the serializer 513, and then, the serial data is transmitted as an optical signal in synchronization with the carrier clock.

Operation of portions related to the audio data transmission of the transmitter 300 and the receiver 400 illustrated in FIG. 3 will be briefly described. The audio clock generated by the audio clock source 406 of the receiver 400 is supplied to the carrier clock generator 407. Furthermore, a 270 MHz video clock (Link Video Clock) is supplied to the carrier clock generator 407. A carrier clock generator 407 generates a carrier clock (Lane Clock) of 1.215 GHz on the basis of an audio clock and a video clock (Link Video Clock) of 270 MHz, and also obtains Maud and Naud as dividing ratio information (refer to FIG. 10).

Maud and Naud as the dividing ratio information obtained by the carrier clock generator 407 are supplied to the ACMSW generator 408. The ACMSW generator 408 generates an ACMSW packet unit as an SS packet unit. The ACMSW packet unit includes AMCLK indicating a switch request to an option mode with the audio clock on the side of the receiver 400 as a master, and also includes Maud and Naud as dividing ratio information output from the carrier clock generator 407.

The ACMSW packet unit generated by the ACMSW generator 408 is supplied to the lane frame generator 409. The lane frame generator 409 generates a lane frame including an SS packet unit such as an ACMSW packet unit as a payload unit (refer to FIG. 4).

The lane frame of the sub stream link generated by the lane frame generator 409 is supplied to the transmission unit 410. The transmission unit 410 optically transmits the lane frame of the sub stream link to the transmitter 300 using an optical cable (refer to FIG. 5(a)). In this case, the transmission data is transmitted as an optical signal in synchronization with the carrier clock.

The reception unit 307 of the transmitter 300 receives a lane frame of a sub stream link optically transmitted from the receiver 400 using an optical cable by the sub stream link (refer to FIG. 5(b)). The reception unit 307 causes the clock and data recovery circuit 308 included in the preceding stage of the de-serializer 613 to recover the carrier clock (Lane Clock) from the input data from the amplifier 612, and reliably receives data on the basis of this carrier clock.

The lane frame of the sub stream link received by the reception unit 307 is supplied to the lane frame decoding unit 309. The lane frame decoding unit 309 applies decode processing on the lane frame of the sub stream link, and retrieves an SS packet unit included in the lane frame, herein the ACMSW packet unit.

The ACMSW packet unit retrieved by the lane frame decoding unit 309 is supplied to the ACMSW decoding unit 310. The ACMSW decoding unit 310 applies decode processing on the ACMSW packet unit, and obtains AMCLK indicating a switch request to an option mode with the audio clock on the receiver 400 side defined as a master stored in the ACMSW packet unit, and obtains Maud and Naud as the dividing ratio information.

In a case where the switch request represented by AMCLK can be handled on the transmitter 300 side, audio clock is recovered on the basis of the carrier clock (Lane Clock) recovered by the clock and data recovery circuit 308 and Maud and Naud as dividing ratio information obtained by the ACMSW decoding unit 310, leading to a state of transmitting audio data in synchronization with the recovered audio clock.

In this case, the carrier clock (Lane Clock) recovered by the clock and data recovery circuit 308 and Maud and Naud as the dividing ratio information obtained by the ACMSW decoding un 310 are supplied to the audio clock recovery unit 311. The audio clock recovery unit 311 recovers an audio clock from the carrier clock (Lane Clock), Maud and Naud (refer to FIG. 9).

The uncompressed or compressed audio data (audio sample data) output from the audio source 301 is input to the FIFO memory unit 302. The FIFO memory unit 302 sequent ally outputs audio data input from the audio source 301 in synchronization with the audio clock recovered by the audio clock recovery unit 311.

The audio data output from the FIFO memory unit 302 is supplied to the ASPU generator 303. The ASPU generator 303 packs this audio data to generate an AS packet unit (ASPU) having audio data inserted in the payload. This AS packet unit is supplied to the lane frame generator 305.

Furthermore, the audio additional information output from the audio source 301 is supplied to the AAPU generator 304. The AAPU generator 304 performs packing of this audio additional information and generates an AA packet unit having audio additional information inserted in the payload. The audio additional information includes information such as sampling frequency, sample size, and an encoding method (uncompressed, compression method). This AA packet unit is supplied to the lane frame generator 305.

The lane frame generator 305 generates a lane frame containing an AS packet unit, an AA packet unit, or the like, as a payload unit. The lane frame of the sub stream link generated by the lane frame generator 305 is supplied to the transmission unit 306. The transmission unit 306 optically transmits the lane frame of the main stream link to the receiver 400 using an optical cable (refer to FIG. 5(a)).

As described above, in a case where the switch request represented by AMCLK can be handled on the transmitter 300 side, audio clock is recovered on the basis of the carrier clock (Lane Clock) recovered by the clock and data recovery circuit 308 and Maud and Naud as dividing ratio information obtained by the ACMSW decoding unit 310, leading to a state of transmitting audio data in synchronization with the recovered audio clock.

In this case, an ACK command is returned from the transmitter 300 side to the receiver 400 side by the sub stream link. Then, on the receiver 400 side, the audio clock is switched to a state using an audio clock generated from the audio clock source 406 as an audio clock.

The reception unit 401 of the receiver 400 receives a lane frame of a main stream link optically transmitted from the transmitter 300 using an optical cable by the main stream link (refer to FIG. 5(b)). The lane frame of the main stream link is supplied to the lane frame decoding unit 402.

The lane frame decoding unit 402 applies decode processing on the lane frame of the main stream link, and extracts the AS packet unit (ASPU) and the AA packet unit (AAPU) contained in the lane frame. As described above, audio data is inserted in the AS packet unit, and audio additional information is inserted in the AA packet unit.

The AS packet unit extracted by the lane frame decoding unit 402 is supplied to the ASPU decoding unit 403. The ASPU decoding unit 403 applies decode processing on the AS packet unit, to allow the audio data to be retrieved. Furthermore, the AA packet unit extracted by the lane frame decoding unit 402 is supplied to the AAPU decoding unit 404. The AAPU decoding unit 404 applies decode processing on the AA packet unit to allow the audio additional information to be retrieved.

The audio data (audio sample data) retrieved by the ASPU decoding unit 403 and the audio additional information retrieved by the AAPU decoding unit 404 are supplied to the audio decoding unit 405. The audio decoding unit 405 processes audio data in synchronization with the audio clock generated by the audio clock source 406 on the basis of the audio additional information so as to obtain output audio data for sound output. Then, the audio decoding unit 405 outputs the output audio data in synchronization with the audio clock generated by the audio clock source 406.

[Configuration Example of Disc Player]

Figure 11:
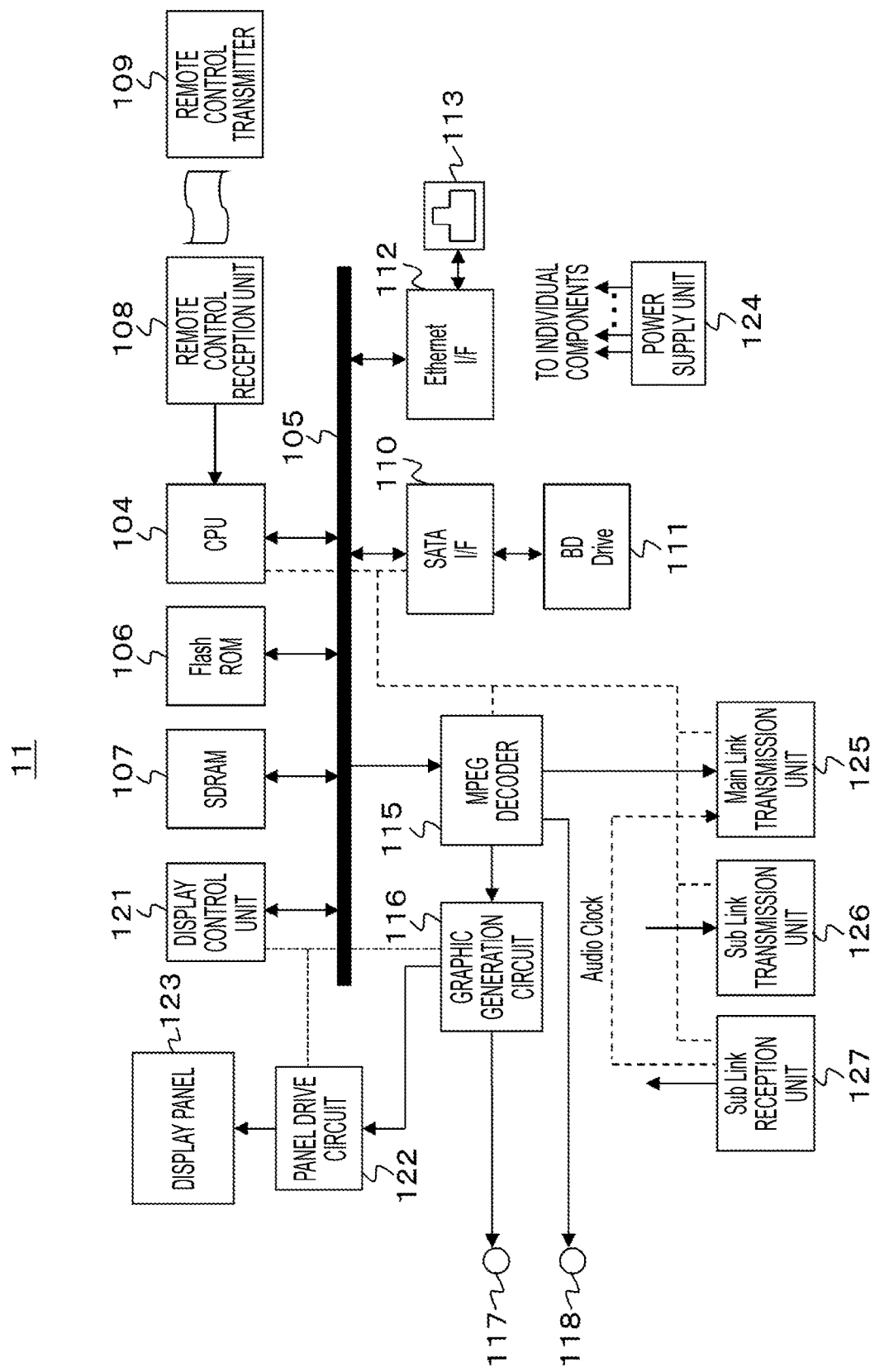
FIG. 11 is a block diagram illustrating a configuration example of a disc player as a specific example of a transmitter.

FIG. 11 illustrates a configuration example of a disc player 11 as a specific example of the transmitter 300. The disc player 11 includes a main stream link transmission unit 125, a sub stream link transmission unit 126, and a sub stream link reception unit 127.

The main stream link transmission unit 125 includes processing units corresponding to the FIFO memory unit 302, the ASPU generator 303, the AAPU generator 304, the lane frame generator 305, the transmission unit 306, or the like, in the transmitter 300 of FIG. 3. The sub stream link reception unit 127 includes processing units corresponding to the reception unit 307, the lane frame decoding unit 309, the ACMSW decoding unit 310, the audio clock recovery unit 311, or the like, in the transmitter 300 in FIG. 3.

Furthermore, the disc player 11 includes a central processing unit (CPU) 104, an internal bus 105, a flash read only memory (ROM) 106, a synchronous random access memory (SDRAM) 107, a remote control reception unit 108, and a remote control transmitter 109.

Furthermore, the disc player 11 includes a serial advanced technology attachment (SATA) interface 110, a blu-ray disc (BD) drive 111, an Ethernet interface (Ethernet I/F) 112, and a network terminal 113. Furthermore, the disc player 11 includes a moving picture expert group (MPEG) decoder 115, a graphic generation circuit 116, a video output terminal 117, and a sound output terminal 118.

Furthermore, the disc player 11 may include a display control unit 121, a panel drive circuit 122, a display panel 123, and a power supply unit 124. Note that "Ethernet" is a registered trademark. The CPU 104, the flash ROM 106, the SDRAM 107, the SATA interface 110, the Ethernet interface 112, the MPEG decoder 115, and the display control unit 121 are connected to the internal bus 105.

The CPU 104 controls operation of individual portions of the disc player 11. The flash ROM 106 stores control software and data. The SDRAM 107 constitutes a work area of the CPU 104. The CPU 104 develops the software and data read from the flash ROM 106 onto the SDRAM 107 to start the software, and controls individual portions of the disc player 11.

The remote control reception unit 108 receives a remote control signal (remote control code) transmitted from the remote control transmitter 109, and supplies the received signal to the CPU 104. The CPU 104 controls individual portions of the disc player 11 in accordance with remote control codes. Note that while the present embodiment illustrates a case where a user instruction input unit is represented by a remote control unit, the user instruction input unit may use another configuration, for example, a switch, a wheel, a touch panel unit on which instructions are input by proximity/touch, a mouse, a keyboard, a gesture input unit that detects an instruction input by a camera, and a sound input unit for inputting instruction by sound, or the like.

The BD drive 111 records content data on a BD disc (not illustrated) as a disc-shaped recording medium or reproduces content data from this BD. The BD drive 111 is connected to the internal bus 105 via the SATA interface 110.

The MPEG decoder 115 applies decode processing on an MPEG 2 stream reproduced by the BD drive 111 to obtain image and sound data.

In transmitting image and sound data from the disc player 11 to an external device (receiver), image and sound data are supplied from, the MPEG decoder 115 to the main stream link transmission unit 125. In this case, the image and sound data may be either compressed data or uncompressed data. In this case, the MPEG decoder 115 constitutes the audio source 301 in a portion related to audio data transmission in FIG. 3.

The graphic generation circuit 116 superimposes graphic data on image data obtained by the MPEG decoder 115 as necessary, for example. The video output terminal 117 outputs the image data output from the graphic generation circuit 116. The sound output terminal 118 outputs the sound data obtained by the MPEG decoder 115.

The panel drive circuit 122 drives the display panel 123 on the basis of the video (image) data output from the graphic generation circuit 260. The display control unit 121 controls the graphics generation circuit 116 and the panel drive circuit 122 to control the display on the display panel 123. The display panel 123 includes a liquid crystal display (LCD), a plasma display panel (PDP), an organic electroluminescence (EL) display, and the like, for example.

Note that while the present embodiment illustrates an example having the display control unit 121 in addition to the CPU 104, the display of the display panel 123 may be directly controlled by the CPU 104. Furthermore, the CPU 104 and the display control unit 121 may be provided in one chip or a plurality of cores. The power supply unit 124 supplies power to individual portions of the disc player 11. The power supply unit 124 may be either an AC power supply or a battery (storage battery, dry battery).

The operation of the disc player 11 illustrated in FIG. 11 will be briefly described. At the time of recording, content data to be recorded is obtained via a digital tuner (not illustrated) or from the network terminal 113 via the Ethernet interface 112. This content data is input to the SATA interface 110 and recorded on a BD by the BD drive 111. In some cases, this content data may be recorded in a hard disk drive (HDD) (not illustrated) connected to the SATA interface 110.

At the time of reproduction, the content data (MPEG stream) reproduced from the BD by the BD drive 111 is supplied to the MPEG decoder 115 via the SATA interface 110. In the MPEG decoder 115, decode processing is performed on the reproduced content data to obtain uncompressed mage and sound data. The image data is output to the video output terminal 117 through the graphic generation circuit 116. Furthermore, the sound data is output to the sound output terminal 118.

Furthermore, at the time of reproduction, the image data obtained by the MPEG decoder 115 is supplied to the panel drive circuit 122 through the graphic generation circuit 116 according to the user operation, and the reproduced image is displayed on the display panel 123. Furthermore, the sound data obtained by the MPEG decoder 115 is supplied to a speaker (not illustrated) in accordance with user operation, and sound corresponding to the reproduced image is output.

Furthermore, in the case of transmitting image and sound data from the disc player 11 to an external device (receiver) at the time of reproduction, the MPEG decoder 115 supplies image and sound data (uncompressed data or uncompressed Data) to the main stream link transmission unit 125 so as to be transmitted to the external device (receiver) by the main stream link.

Note that when the content data reproduced by the BD drive 111 is to be transmitted to a network at the time of reproduction, the content data is output to the network terminal 113 via the Ethernet interface 112. Here, the image data may first be encrypted using a copyright protection technology, for example, HDCP, DTCP, DTCP+, and the like before being output.

In the option mode with the audio clock on the receiver side defined as master, an audio clock recovered at the sub stream link reception unit 127 on the basis of the carrier clock (Lane Clock) together with Maud and Naud as the dividing ratio information is supplied to the main stream link transmission unit 125, as illustrated by broken lines. Then, the main stream link transmission unit 125 performs transmission processing on audio data (audio sample data) on the basis of the recovered audio clock.

[Exemplary Configuration of Television Receiver]

Figure 12:
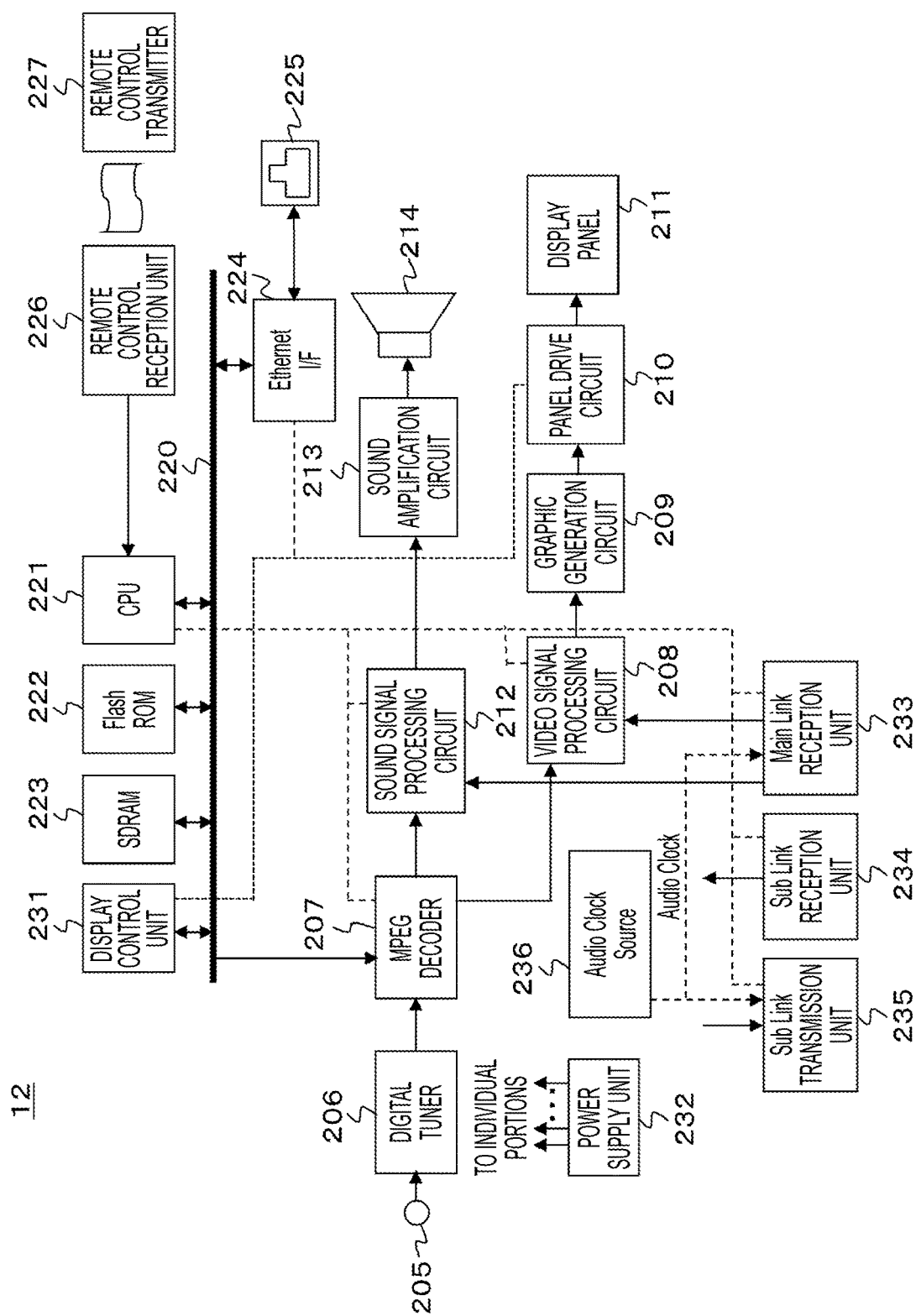
FIG. 12 is a block diagram illustrating a configuration example of a television receiver as a specific example of a receiver.

FIG. 12 illustrates a configuration example of the television receiver 12 as a specific example of the receiver 400. The television receiver 12 includes a main stream link reception unit 233, a sub stream link reception unit 234, a sub stream link transmission unit 235, and an audio clock source 236.

The main stream link reception unit 233 includes processing units corresponding to the reception unit 401, the lane frame decoding unit 402, the ASPU decoding unit 403, the AAPU decoding unit 404, and the audio decoding unit 405, in the receiver 400 of FIG. 3. The sub stream link transmission unit 235 includes a lane clock generator 407, an ACMSW generator 408, a lane frame generator 409, the transmission unit 410 of the sub stream link, or the like in the receiver 400 of FIG. 3.

Furthermore, the television receiver 12 has an antenna terminal 205, a digital tuner 206, an MPEG decoder 207, a video signal processing circuit 208, a graphic generation circuit 209, a panel drive circuit 210, and a display panel 211.

Furthermore, the television receiver 12 includes a sound signal processing circuit 212, a sound amplification circuit 213, a speaker 214, an internal bus 220, a CPU 221, a flash ROM 222, and a synchronous random access memory (SDRAM) 223. Furthermore, the television receiver 12 includes an Ethernet interface (Ethernet I/F) 224, a network terminal 225, a remote control reception unit 226, and a remote control transmitter 227. Furthermore, the television receiver 12 also includes a display control unit 231 and a power supply unit 232. Note that "Ethernet" is a registered trademark.

The CPU 221 controls operation of individual portions of the television receiver 12. The flash ROM 222 stores control software and data. The SDRAM 223 constitutes a work area of the CPU 221. The CPU 221 develops the software and data read from the flash ROM 222 onto the SDRAM 223 to activate the software, and controls individual portions of the television receiver 12.

The remote control reception unit 226 receives a remote control signal (remote control code) transmitted from the remote control transmitter 227, and supplies the received signal to the CPU 221. The CPU 22*l* controls individual portions of the television receiver 12 on the basis of this remote control code. Note that while the present embodiment illustrates a case where a user instruction input unit is represented by a remote control unit, the user instruction input unit may use another configuration, for example, a touch panel unit on which instructions are input by proximity/touch, a mouse, a keyboard, a gesture input unit that detects an instruction input by a camera, and a sound input unit for inputting instruction by sound, or the like.

The network terminal 225 is a terminal connected to a network and is connected to the Ethernet interface 224. The CPU 221, the flash ROM 222, the SDRAM 223, the Ethernet interface 224, the MPEG decoder 207, and the display control unit 231 are connected to the internal bus 220.

The antenna terminal 205 is a terminal for inputting a television broadcast signal received by a reception antenna (not illustrated). The digital tuner 206 processes the television broadcast signal input to the antenna terminal 205 and extracts a partial TS (Transport Stream) (TS packets of video data and TS packets of sound data) from a predetermined transport stream corresponding to selection channel of a user Furthermore, the digital tuner 206 retrieves program specific information/service information (PSI/SI) from the obtained transport stream and outputs it to the CPU 221. The processing of extracting the partial TS of an arbitrary channel from a plurality of transport streams obtained by the digital tuner 206 is enabled by acquisition of information of the packet ID (PID) of the arbitrary channel from the PSI/SI (PAT/PMT).

The MPEG decoder 207 applies decode processing on video packetized elementary stream (PES) packets formed with TS packets of video data obtained by the digital tuner 206 and obtains image data. Furthermore, the MPEG decoder 207 applies decode processing on the sound PES packet formed with TS packets of sound data obtained by the digital tuner 206 and obtains sound data. Furthermore, the MPEG decoder 207 applies decode processing on the content data (image data and sound data) supplied from the network terminal 225 via the Ethernet interface 224 and obtains image and sound data.

The video signal processing circuit 208 and the graphic generation circuit 209 perform scaling processing (resolution conversion processing) graphics data superimposition processing, or the like as necessary on the image data obtained by the MPEG decoder 207 or the image data received by the reception unit 233.

The panel drive circuit 210 drives the display panel 211 on the basis of the video (image) data output from the graphic generation circuit 209. The display control unit 231 controls the graphics generation circuit 209 and the panel drive circuit 210 to control the display on the display panel 211. The display panel 211 includes a liquid crystal display (LCD), a plasma display panel (PDP), an organic electroluminescence (EL) display, and the like, for example.

Note that while the present embodiment illustrates an example having the display control unit 231 in addition to the CPU 221, the display of the display panel 211 may be directly controlled by the CPU 221. Furthermore, the CPU 221 and the display control unit 231 may be provided in one chip or a plurality of cores. The power supply unit 232 supplies power to individual portions of the television receiver 12. The power supply unit 232 may be either an AC power supply or a battery (storage battery, dry battery).

The sound signal processing circuit 212 performs necessary processing such as D/A conversion on the sound data obtained by the MPEG decoder 207 or the sound data received by the reception unit 233. The sound amplification circuit 213 amplifies the sound signal output from the sound signal processing circuit 212 and supplies the amplified signal to the speaker 214.

Note that the speaker 214 can be either monophonic or stereophonic. Furthermore, the number of speakers 214 may be either one, or two or more. Furthermore, the speaker 214 may be an earphone or a headphone. Furthermore, the speaker 214 may be one compatible with 2.1 channels, 5.1 channels, or the like. Furthermore, the speaker 214 may be connected to the television receiver 12 wirelessly. Furthermore, the speaker 214 may be another device.

Note that when the content data received is to be transmitted to a network, the content data is output to the network terminal 225 via the Ethernet interface 224, for example. Here, the image data may first be encrypted using a copyright protection technology, for example, HDCP, DTCP, DTCP+, and the like before being output.

Operation of the television receiver 12 illustrated in FIG. 12 will be briefly described. The television broadcast signal input into the antenna terminal 205 is supplied to the digital tuner 206. The digital tuner 206 processes the television broadcast signal, outputs a predetermined transport stream corresponding to selection channel of a user, extracts a partial TS (TS packets of video data and IS packets of sound data) from the transport stream, and the partial TS is supplied to the MPEG decoder 207.

The MPEG decoder 207 applies decode processing on a video PES packet formed with TS packets of video data to obtain video data. This video data undergoes scaling processing (resolution conversion processing), graphics data superimposition processing or the like in the video signal processing circuit 208 and the graphic generation circuit 209 as necessary and is supplied to the panel drive circuit 210 Accordingly, the display panel 211 displays an image corresponding to the user selected channel.

Furthermore, the MPEG decoder 207 applies decode processing on the audio PES packet formed with TS packets of sound data, leading to acquisition of sound data. This sound data undergoes necessary processing such as D/A conversion by the sound signal processing circuit 212, and is further amplified by the sound amplification circuit 213, and thereafter supplied to the speaker 214. With this operation, the speaker 214 outputs the sound corresponding to the user selected channel.

Furthermore, the content data (image data and sound data) supplied from the network terminal 225 to the Ethernet interface 224 is supplied to the MPEG decoder 207. Thereafter, operation similar to the above ca se of receiving the television broadcast signal is performed, so as to display an image on the display panel 211 and output sound from the speaker 214.

Furthermore, in a case where the television receiver 12 receives image and sound data from an external device (transmitter), the image and sound data receiver by the main stream link reception unit 233 are respectively supplied to the video signal processing circuit. 212 and the sound signal processing circuit 212. Thereafter, operation similar to the above case of receiving the television broadcast signal is performed, so as to display an image on the display panel 211 and output sound from the speaker 214.

Furthermore, in the option mode in which the audio clock on the receiver side is defined as master, the state transitions to a state where the audio clock generated by the audio clock source 236 is used as illustrated by the broken lines.

That is, the sub stream link transmission unit 235 generates a carrier clock (Lane Clock) on the basis of the audio clock and the video clock (Link Video Clock) generated by the audio clock source 236, while obtains values of Maud and Naud as the dividing ratio information. Then, the sub stream link transmission unit 235 transmits the transmission data (serial data) of the lane frame of the sub stream link including the SS packet unit such as the ACMSW packet unit having the value of Maud, Naud, in synchronization with the generated carrier clock (Lane Clock).

Furthermore, the main stream link reception unit 233 processes the received audio data (audio sample data) in synchronization with the audio clock generated by the audio clock source 406, leading to acquisition of output audio data for sound output.

As described above, in the AV system 10 illustrated in FIG. 1, the transmitter 300 (refer to FIG. 3) transmits the audio data to the receiver 400 (refer to FIG. 3) in synchronization with the audio clock obtained by dividing the carrier clock recovered from the received encoded data. Therefore, it is possible to perform high quality audio reproduction in the receiver 400 without supplying a transmission clock using a clock signal line from the receiver 400.

Furthermore, in the AV system 10 illustrated in FIG. 1, the transmitter 300 (refer to FIG. 3) transmits the audio data to the receiver 400 in synchronization with the audio clock generated from the carrier clock recovered from the received encoded data, in accordance with a request from the receiver 400. Accordingly, this enables the transmitter 300 to perform transmission processing effectively, that is, in accordance with the processing capability of the receiver 400.

Furthermore, in the AV system 10 illustrated in FIG. 1, the transmitter 300 (refer to FIG. 3) generates an audio clock by (dividing the carrier clock on the basis of the dividing ratio information obtained from the received encoded data. In this case, the division is performed on the basis of the dividing ratio information transmitted from the external device, making it possible to easily and properly generate the audio clock.

Furthermore, in the AV system 10 illustrated in FIG. 1, the receiver 400 (refer to FIG. 3) transmits encoded data capable of clock recovery in synchronization with the carrier clock generated on the basis of the generated audio clock, to the transmitter 300 (refer to FIG. 3), and processes the audio data received from the transmitter 300 on the basis of the audio clock. Therefore, it is possible to perform high quality audio reproduction without supplying a transmission clock using a clock signal line to the transmitter 300.

Furthermore, in the AV system 10 illustrated in FIG. 1, the receiver 400 (refer to FIG. 3) includes encoded data for the dividing ratio information for obtaining an audio clock from the carrier Clock as encoded data capable of clock recovery to be transmitted to the transmitter 300. Therefore, the transmitter 300 can obtain the audio clock by performing division on the carrier clock recovered from the encoded data on the basis of the dividing ratio information, making it possible to generate the audio clock easily and appropriately.

Furthermore, in the AV system 10 illustrated in FIG. 1, the receiver 400 (refer to FIG. 3) includes encoded data for the request for using an audio clock generated from the recovered carrier clock as encoded data capable of clock recovery to be transmitted to the transmitter 300.

Accordingly, the transmitter 300 can effectively perform transmission processing of audio data based on the audio clock generated from the recovered carrier clock.

2. Modification

Note that the above embodiment is an exemplary case where the disc player 11 (refer to FIG. 11) is illustrated as a specific example of the transmitter 300, and the television receiver 12 (refer to FIG. 12) is further illustrated as a specific example of the receiver 400. However, the transmitter 300 and the receiver 400 are apparently not limited to these.

Furthermore, the present technology can also be configured as follows.

(1) A transmission apparatus including:
an encoded data reception unit that receives encoded data capable of clock recovery from an external device;
an audio clock generator that generates an audio clock on the basis of a carrier clock recovered from the received encoded data; and
an audio data transmission unit that transmits audio data to the external device in synchronization with the generated audio clock.

(2) The transmission apparatus according to (1),
in which the audio clock generator generates the audio clock by dividing the carrier clock on the basis of dividing ratio information obtained from the received encoded data.

(3) The transmission apparatus according to (1) or (2),
in which, when a request for using the audio clock generated on the basis of the recovered carrier clock can be obtained,
the audio clock generator generates an audio clock on the basis of the carrier clock recovered from the encoded data, and
the audio data transmission unit transmits the audio data to the external device in synchronization with the generated audio clock.

(4) The transmission apparatus according to any of (1) to (3),
in which the audio data transmission unit transmits the audio data to the external device through a first physical channel, and the encoded data reception unit receives the encoded data from the external device through a second physical channel.

(5) The transmission apparatus according to (4),
in which each of the first physical channel and the second physical channel is a physical channel using an optical cable.

(6) A transmission method including:
an encoded data reception step of receiving encoded data capable of clock recovery from an external device;
an audio clock generation step of generating an audio clock on the basis of a carrier clock recovered from the received encoded data; and
an audio data transmission step of transmitting audio data to the external device in synchronization with the generated audio clock by an audio data transmission unit.

(7) A reception apparatus including:
an audio clock generator that generates an audio clock;
an encoded data transmission unit that transmits encoded data capable of clock recovery in synchronization with a carrier clock generated on the basis of the generated audio clock to an external device;
an audio data reception unit that receives audio data from the external device; and an audio data processing unit that processes the received
audio data on the basis of the generated audio clock.

(8) The reception apparatus according to (7),
in which the encoded data includes encoded data of dividing ratio information for obtaining the audio clock from the carrier clock, (9) The reception apparatus according to (7) or (8),
in which the encoded data includes encoded data of a request for using an audio clock generated on the basis of the carrier clock.

(10) The reception apparatus according to any of (7) to (9),
in which the audio data reception unit receives the audio data from the external device through a first physical channel, and the encoded data transmission unit transmits the encoded data to the external device through a second physical channel

(11) The reception apparatus according to (10), in which each of the first physical channel and the second physical channel is a physical channel using an optical cable.

(12) A reception method including:

an audio clock generation step of generating an audio clock;

an encoded data transmission step of transmitting encoded data capable of clock recovery in synchronization with a carrier clock generated on the basis of the generated audio clock to an external device;

an audio data reception step of receiving audio data by an audio data reception unit from the external device; and an audio data processing step of processing the received audio data on the basis of the generated audio clock.

(13) A transmission/reception system having a transmission apparatus and a reception apparatus mutually connected via a physical channel, in which the transmission apparatus includes:

an encoded data reception unit that receives encoded data capable of clock recovery from the reception apparatus;

an audio clock generator that generates an audio clock on the basis of a carrier clock recovered from the received encoded data; and an audio data transmission unit that transmits audio data to the reception apparatus in synchronization with the generated audio clock, and the reception apparatus includes:

an audio clock generator that generates an audio clock;

an encoded data transmission unit that transmits encoded data capable of clock recovery in synchronization with a carrier clock generated on the basis of the generated audio clock to the transmission apparatus;

an audio data reception unit that receives audio data from the transmission apparatus; and an audio data processing unit that processes the received audio data on the basis of the generated audio clock.

REFERENCE SIGNS LIST

AV transmission system
60 Main stream link
70 Sub stream link
104 CPU
105 Internal bus
106 Flash ROM
107 SDRAM
108 Remote control reception unit
109 Remote control transmitter
110 SATA interface
111 BD drive
112 Ethernet interface
113 Network terminal
115 MPEG decoder
116 Graphic generation circuit
117 Video output terminal
118 Sound output terminal
121 Display control unit
122 Panel drive circuit
123 Display panel
124 Power supply unit
125 Main stream link transmission unit
126 Sub stream link transmission unit
127 Sub stream link reception unit
205 Antenna terminal
206 Digital tuner
207 MPEG decoder
208 Video signal processing circuit
209 Graphic generation circuit
210 Panel drive circuit
211 Display panel
212 Sound signal processing circuit
213 Sound amplification circuit
214 Speaker
220 Internal bus
221 CPU
222 Flash ROM
223 SDRAM
224 Ethernet interface
225 Network terminal
226 Remote control reception unit
227 Remote control transmitter
231 Display control unit
232 Power supply unit
233 Main stream link reception unit
234 Sub stream link reception unit
235 Sub stream link transmission unit
236 Audio clock source
300 Transmitter
301 Audio source
302 FIFO memory unit
303 ASPU generator
304 AAPU generator
305 Lane frame generator
306 Transmission unit of main stream link
307 Reception unit of sub stream link
308 CDR unit
308a Phase frequency detector
308b Loop filter
308c Voltage controlled oscillator
308d Data register
309 Lane frame decoding unit
310 ACMSW decoding unit
311 Audio clock recovery unit
311a, 311b, 311c, 311e Divider
311d PLL circuit
400 Receiver
401 Reception unit of main stream link
402 Lane frame decoding unit
403 ASPU decoding unit
404 AAPU decoding unit
405 Audio decoding unit
406 Audio clock source
407 Lane clock generator
407a Naud generator
407b, 407c Counting unit
407d Latch unit
407e, 407f Multiplier
408 ACMSW generator
409 Lane frame generator
410 Transmission unit of sub stream link
511 Scrambler
512 8B/10B encoder
513 Serializer
514 Laser diode driver
515 Laser diode
521 Photodetector
522 Amplifier
523 De-serializer
524 8B/10B decoder
525 Descrambler
601 Data packing unit 602 VCR/ACR generator
603 Frame generator
604 Multi-stream constructor
605 Channel mapper
606 Channel de-mapper
607 Multi-stream de-constructor
608 Packet generator
609 Data de packing unit
610 Video/audio clock unit
701a, 701b Data packing unit
702a, 702b Frame generator
703a, 703b Packet generator
704a, 704b Data de-packing unit

The invention claimed is:

1. A transmission apparatus comprising:
an encoded data reception unit that receives encoded data including an audio clock master switch packet capable of clock recovery from an external device, wherein the audio clock master switch packet is generated based on an audio clock source of the external device;
an audio clock generator that generates an audio clock on the basis of a carrier clock recovered from the received encoded data, wherein the audio clock generator generates the audio clock by dividing the carrier clock on the basis of dividing ratio information obtained from the audio clock master switch packet of the received encoded data; and
an audio data transmission unit that transmits audio data to the external device in synchronization with the generated audio clock,
wherein the encoded data including the audio clock master switch packet is received from the external device using a sub stream link,
wherein the audio data is transmitted to the external device using a main stream link in synchronization with the generated audio clock that is generated on the basis of the carrier clock recovered from the encoded data received from the external device using the sub stream link,
wherein the audio data is decoded for output by the external device based on the audio clock source of the external device used to generate the audio clock master switch packet, and
wherein the encoded data reception unit, the audio clock generator, and the audio data transmission unit are each implemented via at least one processor.

2. The transmission apparatus according to claim 1,
wherein, when a request for using the audio clock generated on the basis of the recovered carrier clock is obtained,
the audio clock generator generates an audio clock on the basis of the carrier clock recovered from the encoded data, and
the audio data transmission unit transmits the audio data to the external device in synchronization with the generated audio clock.

3. The transmission apparatus according to claim 1,
wherein the audio data transmission unit transmits the audio data to the external device through a first physical channel as the main stream link, and
the encoded data reception unit receives the encoded data from the external device through a second physical channel as the sub stream link.

4. The transmission apparatus according to claim 3,
wherein each of the first physical channel and the second physical channel comprises a physical channel using an optical cable.

5. A transmission method comprising:
receiving encoded data including an audio clock master switch packet capable of clock recovery from an external device, wherein the audio clock master switch packet is generated based on an audio clock source of the external device;
generating an audio clock on the basis of a carrier clock recovered from the received encoded data, wherein generating the audio clock comprises dividing the carrier clock on the basis of dividing ratio information obtained from the audio clock master switch packet of the received encoded data; and
transmitting audio data to the external device in synchronization with the generated audio clock by an audio data transmission unit,
wherein the encoded data including the audio clock master switch packet is received from the external device using a sub stream link,
wherein the audio data is transmitted to the external device using a main stream link in synchronization with the generated audio clock that is generated on the basis of the carrier clock recovered from the encoded data received from the external device using the sub stream link, and
wherein the audio data is decoded for output by the external device based on the audio clock source of the external device used to generate the audio clock master switch packet.

6. A reception apparatus comprising:
an audio clock generator that generates an audio clock master switch packet based on an audio clock source of the reception apparatus;
an encoded data transmission unit that transmits encoded data including the audio clock master switch packet capable of clock recovery in synchronization with a carrier clock generated on the basis of the generated audio clock to an external device;
an audio data reception unit that receives audio data from the external device; and
an audio data processing unit that processes the received audio data on the basis of the generated audio clock,
wherein the audio clock master switch packet of the encoded data includes encoded data of dividing ratio information for obtaining the audio clock from the carrier clock,
wherein the encoded data including the audio clock master switch packet is transmitted to the external device using a sub stream link,
wherein the audio data is received from the external device using a main stream link in synchronization with the generated audio clock that is generated on the basis of the carrier clock recovered from the encoded data transmitted to the external device using the sub stream link,
wherein the audio data is decoded for output by the reception apparatus based on the audio clock source of the reception apparatus used to generate the audio clock master switch packet, and
wherein the audio clock generator, the encoded data transmission unit, the audio data reception unit, and the audio data processing unit are each implemented via at least one processor.

7. The reception apparatus according to claim 6,
wherein the audio clock master switch packet of the encoded data includes encoded data of a request for using an audio clock generated on the basis of the carrier clock.

8. The reception apparatus according to claim 6,
wherein the audio data reception unit receives the audio data from the external device through a first physical channel as the main stream link, and
the encoded data transmission unit transmits the encoded data to the external device through a second physical channel as the sub stream link.

9. The reception apparatus according to claim 8,
wherein each of the first physical channel and the second physical channel comprises a physical channel using an optical cable.

10. A reception method comprising:
generating an audio clock and an audio clock master switch packet based on an audio clock source of a reception apparatus;
transmitting encoded data including the audio clock master switch packet capable of clock recovery in synchronization with a carrier clock generated on the basis of the generated audio clock from the reception apparatus to an external device;
receiving audio data from the external device; and
processing the received audio data on the basis of the generated audio clock,
wherein the audio clock master switch packet of the encoded data includes encoded data of dividing ratio information for obtaining the audio clock from the carrier clock,
wherein the encoded data including the audio clock master switch packet is transmitted to the external device using a sub stream link,
wherein the audio data is received by the reception apparatus from the external device using a main stream link in synchronization with the generated audio clock that is generated on the basis of the carrier clock recovered from the encoded data transmitted to the external device using the sub stream link, and
wherein the audio data is decoded for output by the reception apparatus based on the audio clock source of the reception apparatus used to generate the audio clock master switch packet.

11. A transmission/reception system having a transmission apparatus and a reception apparatus mutually connected via a physical channel,
wherein the transmission apparatus includes:
an encoded data reception unit that receives encoded data including an audio clock master switch packet capable of clock recovery from the reception apparatus, wherein the audio clock master switch packet is generated based on an audio clock source of the reception apparatus;
an audio clock generator that generates an audio clock on the basis of a carrier clock recovered from the received encoded data, wherein the audio clock generator generates the audio clock by dividing the carrier clock on the basis of dividing ratio information obtained from the audio clock master switch packet of the received encoded data; and
an audio data transmission unit that transmits audio data to the reception apparatus in synchronization with the generated audio clock, and
the reception apparatus includes:
an audio clock generator that generates an audio clock based on the audio clock source of the reception apparatus;
an encoded data transmission unit that transmits the encoded data including the audio clock master switch packet capable of clock recovery in synchronization with a carrier clock generated on the basis of the generated audio clock to the transmission apparatus;
an audio data reception unit that receives the audio data from the transmission apparatus; and
an audio data processing unit that processes the received audio data on the basis of the generated audio clock,
wherein the transmission apparatus receives the encoded data including the audio clock master switch packet from the reception apparatus using a sub stream link,
wherein the transmission apparatus transmits the audio data to the reception apparatus using a main stream link in synchronization with the generated audio clock that is generated on the basis of the carrier clock recovered from the encoded data received from the reception apparatus using the sub stream link,
wherein the audio data is decoded for output by the reception apparatus based on the audio clock source of the reception apparatus used to generate the audio clock master switch packet, and
wherein the encoded data reception unit, the audio clock generator, and the audio data transmission unit of the transmission apparatus and the audio clock generator, the encoded data transmission unit, the audio data reception unit, and the audio data processing unit of the reception apparatus are each implemented via at least one processor.

12. The transmission apparatus according to claim 1,
wherein the dividing ratio information includes Maud and Naud,
wherein Maud is a count value of a video clock, and
wherein Naud is a count interval of the generated audio clock.

13. The transmission apparatus according to claim 1,
wherein the carrier clock is generated by the external device based on an audio clock generated by the audio clock source and a video clock.

* * * * *